United States Patent
Segawa et al.

(10) Patent No.: US 10,538,842 B2
(45) Date of Patent: Jan. 21, 2020

(54) DEPOSITION DEVICE HAVING COOLER WITH LIFTING MECHANISM

(71) Applicant: KOBE STEEL, LTD., Kobe-shi (JP)

(72) Inventors: Toshiki Segawa, Takasago (JP); Atsushi Ishiyama, Takasago (JP); Hirofumi Fujii, Takasago (JP)

(73) Assignee: Kobe Steel, Ltd., Kobe-shi (JP)

(*) Notice: Subject to any disclaimer, the term of this patent is extended or adjusted under 35 U.S.C. 154(b) by 21 days.

(21) Appl. No.: 14/786,025

(22) PCT Filed: May 15, 2014

(86) PCT No.: PCT/JP2014/062934
§ 371 (c)(1),
(2) Date: Oct. 21, 2015

(87) PCT Pub. No.: WO2014/192551
PCT Pub. Date: Dec. 4, 2014

(65) Prior Publication Data
US 2016/0068946 A1  Mar. 10, 2016

(30) Foreign Application Priority Data
May 27, 2013  (JP) ................................ 2013-110997

(51) Int. Cl.
*C23C 14/54* (2006.01)
*C23C 14/50* (2006.01)
(Continued)

(52) U.S. Cl.
CPC .............. *C23C 14/541* (2013.01); *B05C 9/14* (2013.01); *C23C 14/505* (2013.01);
(Continued)

(58) Field of Classification Search
CPC ...... C23C 14/505; C23C 14/541; B05C 13/00; B05C 9/14; B05C 14/3407
See application file for complete search history.

(56) References Cited

U.S. PATENT DOCUMENTS 2,598,466 A * 5/1952 Tuttle ...................... B05B 5/082
                                                      118/633
2,730,988 A * 1/1956 Starkey .................... B05B 5/082
                                                      118/314
(Continued)

FOREIGN PATENT DOCUMENTS

JP  01-136966 A  5/1989
JP  06-073538 A  3/1994
(Continued)

OTHER PUBLICATIONS

International Search Report dated Jul. 8, 2014 for PCT/JP2014/062934 filed on May 15, 2014.
(Continued)

*Primary Examiner* — Karl Kurple
(74) *Attorney, Agent, or Firm* — Oblon, McClelland, Maier & Neustadt, L.L.P.

(57) ABSTRACT

A deposition device includes: a cooling unit that cools workpieces; a rotating table main body that rotates around a vertical axis, this rotating table main body having a cooling unit placement portion on which the cooling unit is placed and workpiece placement portions which are arranged so as to surround the periphery of the cooling unit placement portion and on which the workpieces are placed respectively; a lifting mechanism that lifts and lowers the cooling unit, inside the space, between a first position in which the cooling unit is placed on the rotating table main body and a second position in which the cooling unit is spaced upward from the rotating table main body and faces side surfaces of the workpieces placed on the workpiece placement portions;
(Continued)

and refrigerant piping attached to the chamber and detachably connected to the cooling unit to supply the refrigerant to the cooling unit.

7 Claims, 11 Drawing Sheets

(51) Int. Cl.
B05C 9/14 (2006.01)
B05C 13/00 (2006.01)
B05C 11/10 (2006.01)
C23C 14/34 (2006.01)

(52) U.S. Cl.
CPC ........... B05C 11/1015 (2013.01); B05C 13/00 (2013.01); C23C 14/3407 (2013.01)

(56) References Cited

U.S. PATENT DOCUMENTS

| 3,744,449 | A | * | 7/1973 | Guttman | B05B 5/082 |
| | | | | | 118/324 |
| 4,628,859 | A | * | 12/1986 | Hines | B05B 5/082 |
| | | | | | 118/500 |
| 5,131,460 | A | * | 7/1992 | Krueger | C23C 14/541 |
| | | | | | 118/50 |
| 5,380,420 | A | | 1/1995 | Tsuji | |
| 5,591,264 | A | * | 1/1997 | Sugimoto | B05C 11/08 |
| | | | | | 118/320 |
| 5,730,847 | A | * | 3/1998 | Hanaguri | C23C 14/325 |
| | | | | | 118/719 |
| 5,932,078 | A | * | 8/1999 | Beers | H01J 37/32577 |
| | | | | | 204/192.38 |
| 6,036,828 | A | * | 3/2000 | Beers | H01J 37/32055 |
| | | | | | 118/723 VE |
| 6,357,143 | B2 | * | 3/2002 | Morad | H01L 21/67109 |
| | | | | | 34/412 |
| 6,602,348 | B1 | * | 8/2003 | Rogelstad | H01L 21/67109 |
| | | | | | 118/719 |
| 6,949,143 | B1 | * | 9/2005 | Kurita | B65G 49/068 |
| | | | | | 118/719 |
| 7,641,434 | B2 | * | 1/2010 | Kurita | B65G 49/068 |
| | | | | | 118/719 |
| 9,209,062 | B1 | * | 12/2015 | Kukas | B05C 11/08 |
| 9,527,097 | B2 | * | 12/2016 | Savage | B05B 5/082 |
| 9,786,474 | B2 | * | 10/2017 | Balzano | C23C 14/325 |
| 2001/0003965 | A1 | * | 6/2001 | Sada | H01L 21/6715 |
| | | | | | 118/63 |
| 2002/0014894 | A1 | * | 2/2002 | Yonezawa | G01R 31/2865 |
| | | | | | 324/750.08 |
| 2003/0113473 | A1 | * | 6/2003 | Mann | B05B 5/082 |
| | | | | | 427/458 |
| 2003/0170399 | A1 | * | 9/2003 | Owed, Jr. | B05B 5/082 |
| | | | | | 427/458 |
| 2004/0074445 | A1 | * | 4/2004 | Fujii | C23C 14/541 |
| | | | | | 118/723 VE |
| 2006/0174837 | A1 | * | 8/2006 | Fujii | G03F 7/70841 |
| | | | | | 118/733 |
| 2007/0199506 | A1 | * | 8/2007 | Ahmed | B05D 1/02 |
| | | | | | 118/66 |
| 2007/0240982 | A1 | * | 10/2007 | Tamagaki | C23C 14/325 |
| | | | | | 204/298.41 |
| 2009/0056623 | A1 | * | 3/2009 | Crowley | B05B 5/082 |
| | | | | | 118/324 |
| 2009/0065348 | A1 | * | 3/2009 | Fujii | C23C 14/325 |
| | | | | | 204/192.11 |
| 2013/0021753 | A1 | * | 1/2013 | Enami | H05K 3/306 |
| | | | | | 361/709 |
| 2014/0202852 | A1 | * | 7/2014 | Plaisted | C23C 14/3414 |
| | | | | | 204/298.13 |

FOREIGN PATENT DOCUMENTS

| JP | 2006-169590 A | 6/2006 |
| KR | 10-2004-0034432 A | 4/2004 |

OTHER PUBLICATIONS

International Preliminary Report on Patentability and Written Opinion of the International Searching Authority dated Dec. 10, 2015 in PCT/JP2014/062934 (submitting English translation).

* cited by examiner

DEPOSITION DEVICE HAVING COOLER WITH LIFTING MECHANISM

TECHNICAL FIELD

The present invention relates to a deposition device and a deposition method using same.

BACKGROUND ART

When the surface of a workpiece is subjected to the conventional deposition treatment such as arc discharge or sputtering, the workpiece temperature rises because high-energy particles such as metal ions or gas ions collide with the workpiece. Therefore, the deposition treatment needs to be performed while cooling the workpiece.

However, the workpieces are usually placed on a rotating table and revolved around a vertical axis while performing the deposition treatment. This means that the workpieces do not remain stationary on the same places. Therefore, even when a cooling unit for cooling a chamber is disposed inside the chamber, the cooling unit cannot be brought into contact with the revolving workpieces and a constant distance cannot be maintained between the cooling unit and workpieces. The resultant problem is that the workpieces cannot be stably cooled.

Accordingly, a deposition device has been suggested in which a cooling unit is placed on a rotating table inside a vacuum chamber and workpieces are cooled while rotating the cooling unit together with the workpieces, as described in Patent Literature 1. In this deposition device, the cylindrical cooling unit is installed vertically and fixed in the center of the upper surface of the rotating table. A plurality of workpieces is arranged side by side on the circumferential side of the upper surface of the rotating table. Therefore, when the rotating table is rotated, the cooling unit is rotated in the center of the upper surface of the rotating table. At the same time, the plurality of workpieces is revolved around the cooling unit.

The cooling unit is connected to refrigerant piping attached to the chamber wall, and a refrigerant, such as water, circulates through the refrigerant piping between the cooling unit and the chamber. As a result, the cooling unit is cooled. The outer circumferential surface of the cylindrical cooling unit functions as a cooling surface that faces the workpieces at all times, absorbs the radiant heat from the workpieces, and cools the workplaces. Even when the workpieces rotate together with the rotating table, they face the cooling unit at all times. Therefore, although the workpieces and cooling unit are set apart, the radiant heat from the workpieces to the cooling unit can be continuously transferred thereto.

The refrigerant piping and cooling unit are connected through a rotary joint. As a result, the refrigerant, such as cooling water, is continuously supplied through the rotary joint to the cooling unit rotating together with the rotating table, and the refrigerant can be discharged from the cooling unit. The rotary joint is configured such that a fluid is circulated between two physical bodies rotating relative to each other.

The deposition device has a configuration in which the refrigerant is supplied to and discharged from the cooling unit, which rotates together with the rotating table, through the rotary joint. Since the rotary joint in which the refrigerant circulates is thus used inside the vacuum chamber, there is a high risk of the refrigerant leaking from the rotary joint. Further, the device structure should be made more complex by including a differential evacuation mechanism in order to increase the sealing ability of the rotary joint.

While the rotating table is rotated, the cooling unit rotates on the center of the upper surface of the rotating table. At the same time, a plurality of workpieces revolves around the periphery of the cooling unit synchronously with the rotation of the cooling unit. Therefore, the relative positional relationship between the cooling unit and the workpieces arranged on the periphery of the cooling unit does not change. Thus, certain portions of the cooling surface on the outer circumference of the cooling unit are maintained in a state of facing the workpieces, whereas other portions are maintained in a state of not facing the workpieces. Therefore, the cooling surface facing the workpieces is exposed at all times to the radiant heat from the workpieces and cannot be maintained in a low-temperature state. Meanwhile, the cooling surface that does not face the workpieces is in the low-temperature state at all times. Such a state of the cooling surfaces does not conform to the purpose of the cooling unit which is to ensure that the cooling surface with the lowest temperature faces and cools the workpieces. As a consequence, the cooking efficiency of the cooling unit is degraded. In other words, with the above-described structure, the cooling unit and the workpieces rotate together. Therefore, the portions of the cooling surface that face the workpieces receive the radiant heat from the workpieces at all times and are at a temperature higher than that of the cooling surface that does not face the workpieces. Meanwhile, the surface that does not face the workpieces, does not receive the radiant heat and maintains a low-temperature state. As a result, the cooling efficiency of the entire cooling unit is degraded. The resultant problem is that the cooling surface of the cooling unit is not used effectively and that the efficiency of cooling the workpieces with the cooling unit is difficult to increase.

CITATION LIST

Patent Literature

Patent Literature 1: Japanese Unexamined Patent Publication No. 2006-169590 (FIG. 2)

SUMMARY OF INVENTION

It is an objective of the present invention to provide a deposition device and a deposition method capable of improving cooling efficiency and having greatly reduced risk of refrigerant leaks.

The deposition device in accordance with the present invention performs deposition treatment while cooling workpieces. The deposition device includes: a chamber that has a space in which the workpieces are accommodated and the deposition treatment of the workpieces is performed; a cooling unit that cools the workpieces inside the space; a rotating table that rotates around a vertical axis in a state in which the workpieces are placed thereon and that has a cooling unit placement portion configured to allow the cooling unit to be placed thereon and workpiece placement portions which are arranged so as to surround the periphery of the cooling unit placement portion and configured to allow the workpieces to be placed thereon respectively; a lifting mechanism that lifts and lowers the cooling unit, inside the space, between a first position in which the cooling unit is placed on the rotating table and a second position in which the cooling unit is spaced upward from the rotating table and faces side surfaces of the workpieces placed on the workpiece placement portions; and refrigerant piping that is attached to the chamber and detachably connected to the cooling unit to supply a refrigerant to the cooling unit.

DESCRIPTION OF EMBODIMENTS

The embodiments of the deposition device in accordance with the present invention and a deposition method using the deposition device will be explained hereinbelow in detail with reference to the appended drawings.

First Embodiment

Figure 1:
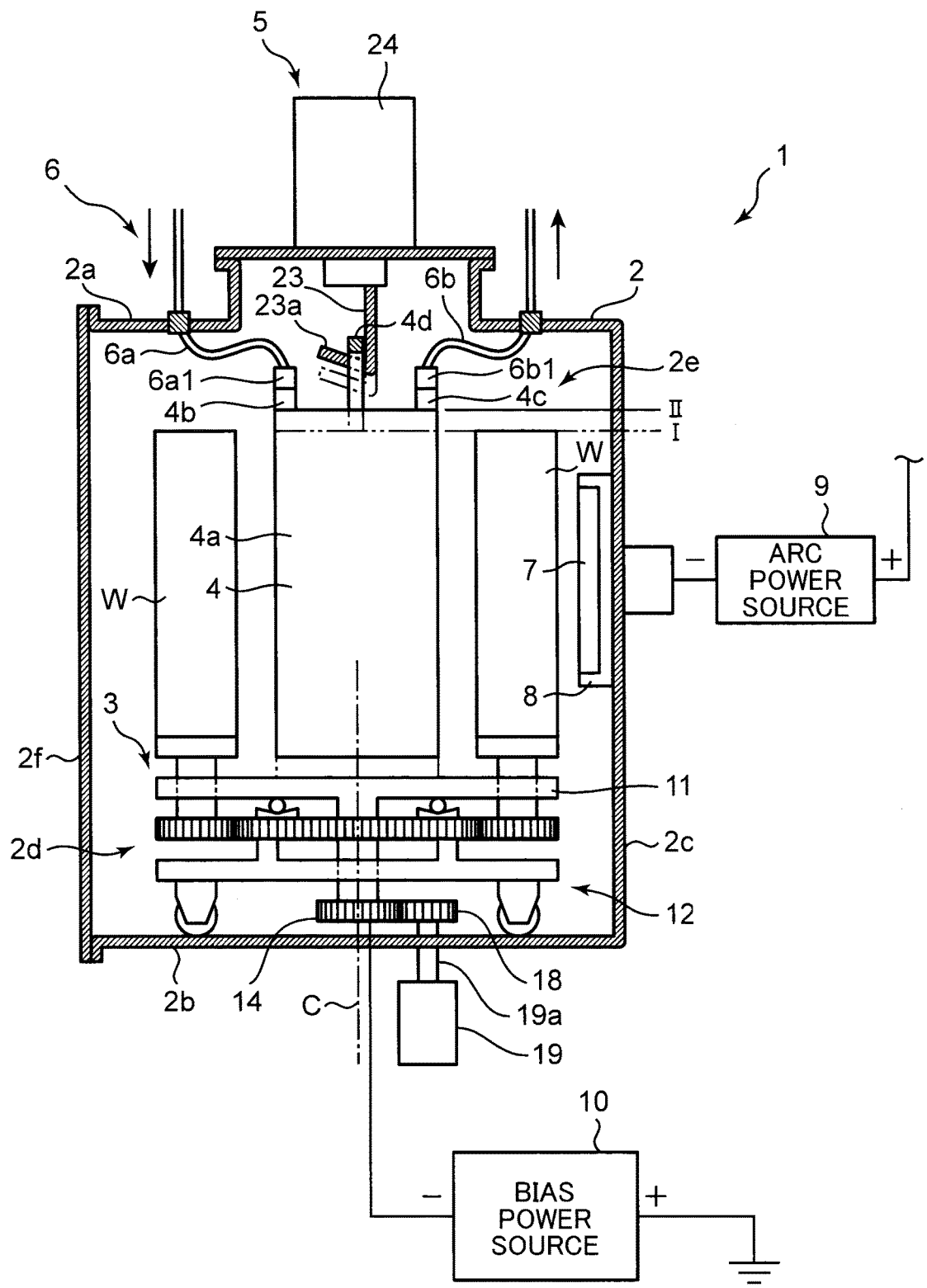
FIG. 1 is a cross-sectional view illustrating the entire configuration of the deposition device according to the first embodiment of the present invention.

A deposition device 1 depicted in FIG. 1 is equipped with a chamber 2, a rotating table unit 3, a cooling unit 4, a lifting mechanism 5, cooling piping 6, a target 7, a target electrode 8, an arc power source 9, and a bias power source 10. The deposition device 1 performs deposition treatment on the surface of a plurality of workpieces W while cooling the workpieces W with the cooling unit 4.

Figure 3:
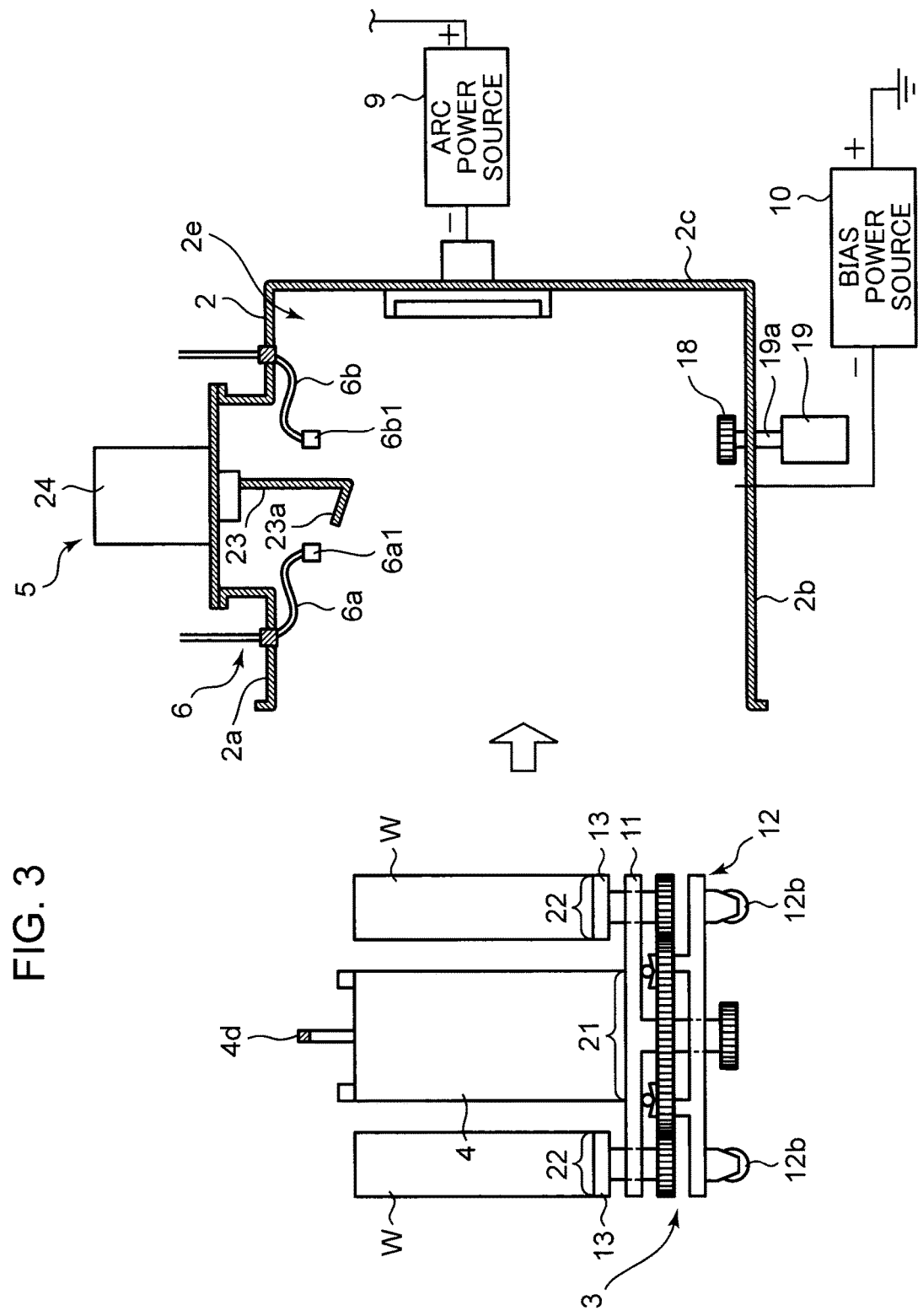
FIG. 3 is an explanatory drawing illustrating the step for placing the workpieces and cooling unit on the rotating table unit and inserting the rotating table unit into a chamber in the deposition method using the deposition device depicted in FIG. 1.

The chamber 2 is constituted by a hollow housing. More specifically, the chamber 2 has a top wall 2a, a bottom wall 2b positioned below the top wall 2a, four side walls 2c connecting side edges of the top wall 2a and bottom wall 2b, and a door 2f. Those top wall 2a, bottom wall 2b, and four side walls 2c form a space 2e where the workpieces W are accommodated and the deposition treatment of the workpieces W is performed. An opening 2d is formed in one of the four side walls 2c of the chamber 2. In the present embodiment, the opening 2d is formed over the entire side wall 2c, as depicted in FIG. 3, but the opening may be also formed in part of the side wall 2c. The door 2f is attached to the opening 2d so as to open and close the opening 2d. The opening 2d communicates the space 2e with the outside of the chamber 2. The opening 2d has dimensions such that the rotating table unit 3, the cooling unit 4, and the workpieces W can be advanced through the opening 2d into the space 2e of the chamber 2 and can be removed from the space 2e.

Figure 2:
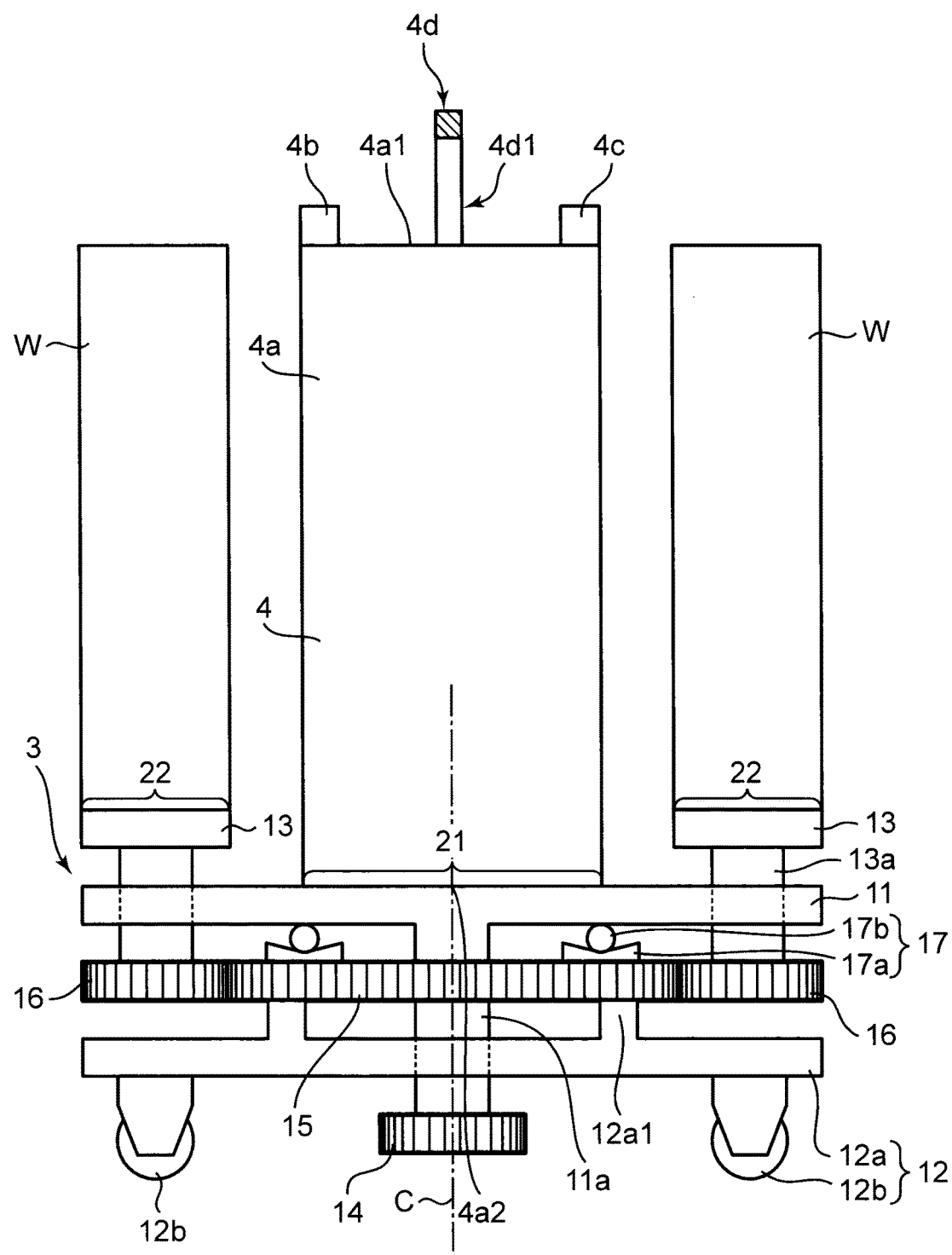
FIG. 2 is a front view illustrating a rotating table unit depicted in FIG. 1 and workpieces and a cooling unit placed thereon.

As depicted in FIGS. 1 and 2, the cooling unit 4 is configured to cool the workpieces W inside the space 2e. The cooling unit 4 has a main body portion 4a having a flow channel where a refrigerant, such as water, circulates, an introducing portion 4b that introduces the refrigerant into the main body portion 4a, a discharge portion 4c that discharges the refrigerant from the main body portion 4a, and an engagement portion 4d which is engaged with the below-described hook 23.

The engagement portion 4d is provided at the upper end of the main body portion 4a of the cooling unit 4. The engagement portion 4d has a shape engageable with the hook 23, for example, an annular or circular arc shape. The engagement portion 4d has an insertion hole 4d1 that is open sidewise.

Figure 7A:
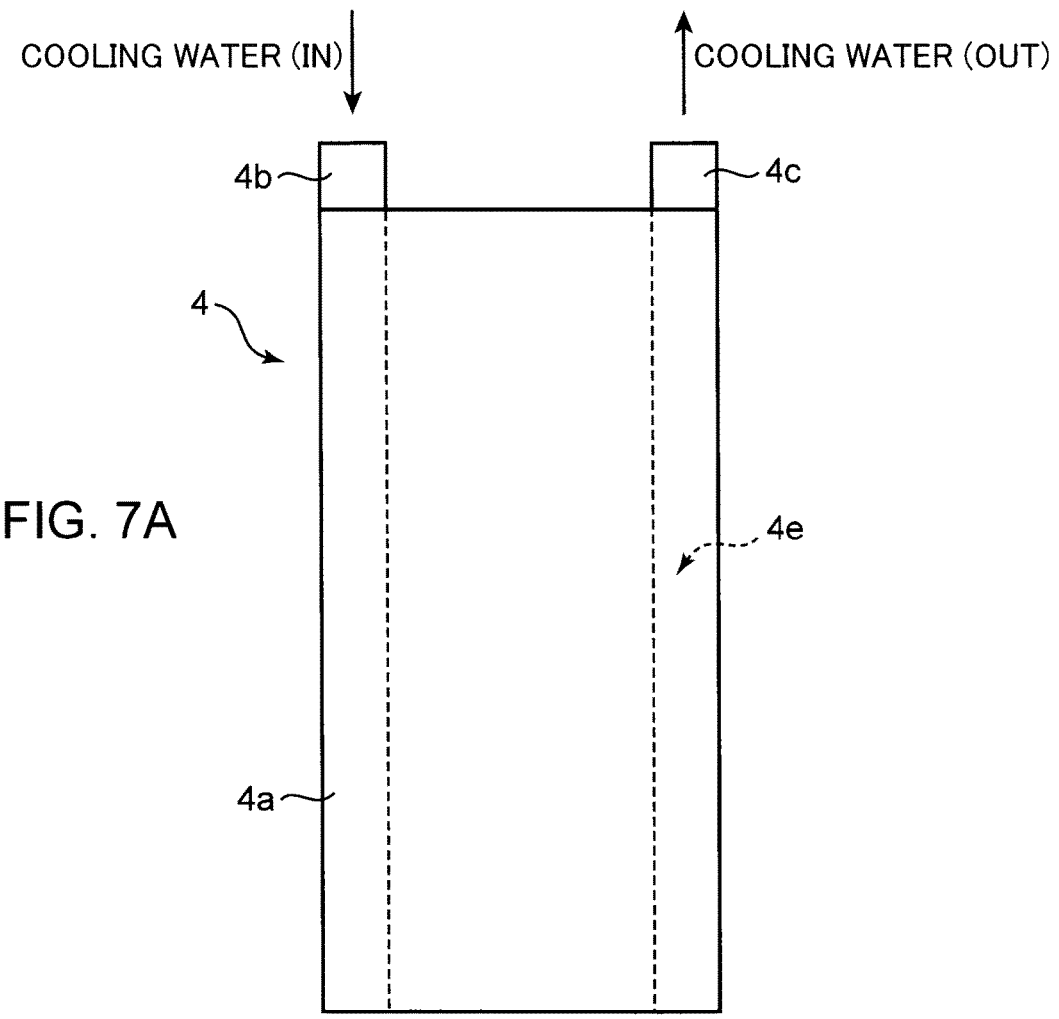
FIG. 7A is a front view of the cooling unit depicted in FIG. 1.
Figure 7B:
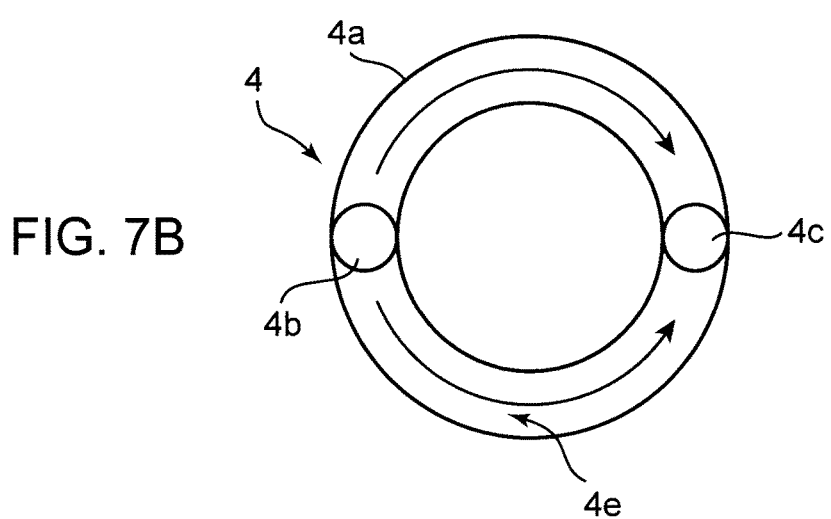
FIG. 7B is a plan view of the cooling unit depicted in FIG. 1.

In the present invention, the shape of the interior of the main body portion 4a is not particularly limited. As an example of the main body portion 4a, as depicted in FIGS. 7A and 7B, the main body portion 4a is used of a shape obtained by combining concentrically two cylinders of different diameters and forming the annular flow channel 4e. In the main body portion 4a, the introducing portion 4b and the discharge portion 4c are arranged inside the flow channel 4e to be spaced apart half the circumference of the annular flow channel 4e. Therefore, the refrigerant introduced from the introducing portion 4b into the main body portion 4a can flow clockwise and counterclockwise to the discharge portion 4c through half the circumference of the annular flow channel 4e.

Figure 8A:
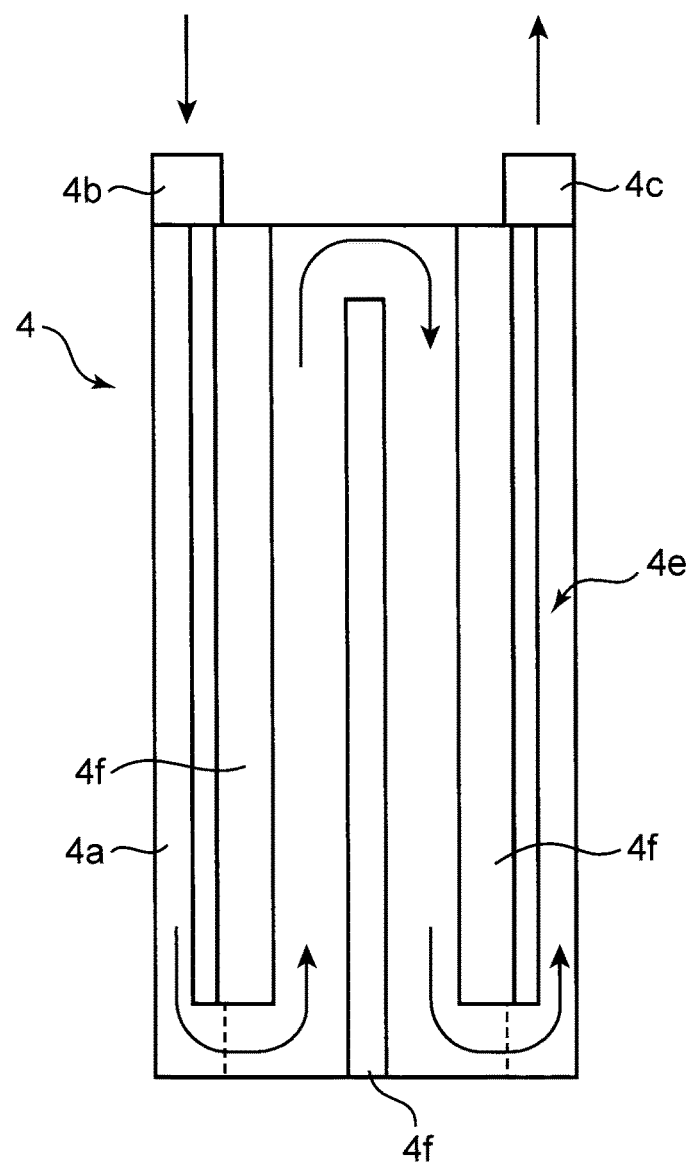
FIG. 8A is a cross-sectional view in which the main body portion of the cooling unit, which is a variation example of the cooling unit in accordance with the present invention, is cut in the vertical direction.
Figure 8B:
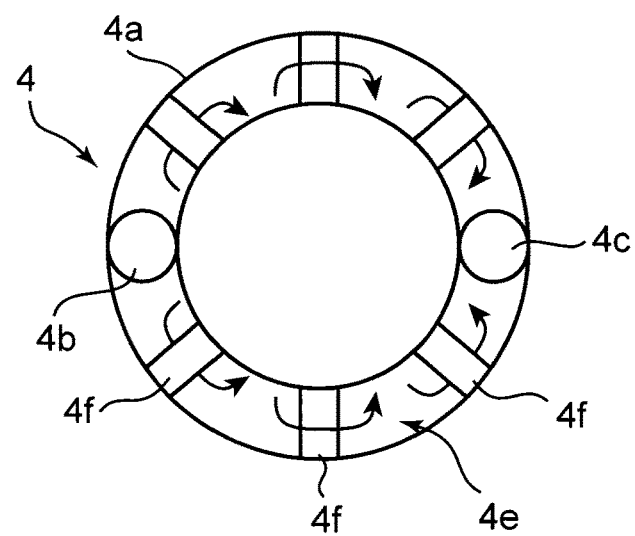
FIG. 8B is a cross-sectional view in which the main body portion of the cooling unit depicted in FIG. 8A is cut in the transverse direction.
Figure 9A:
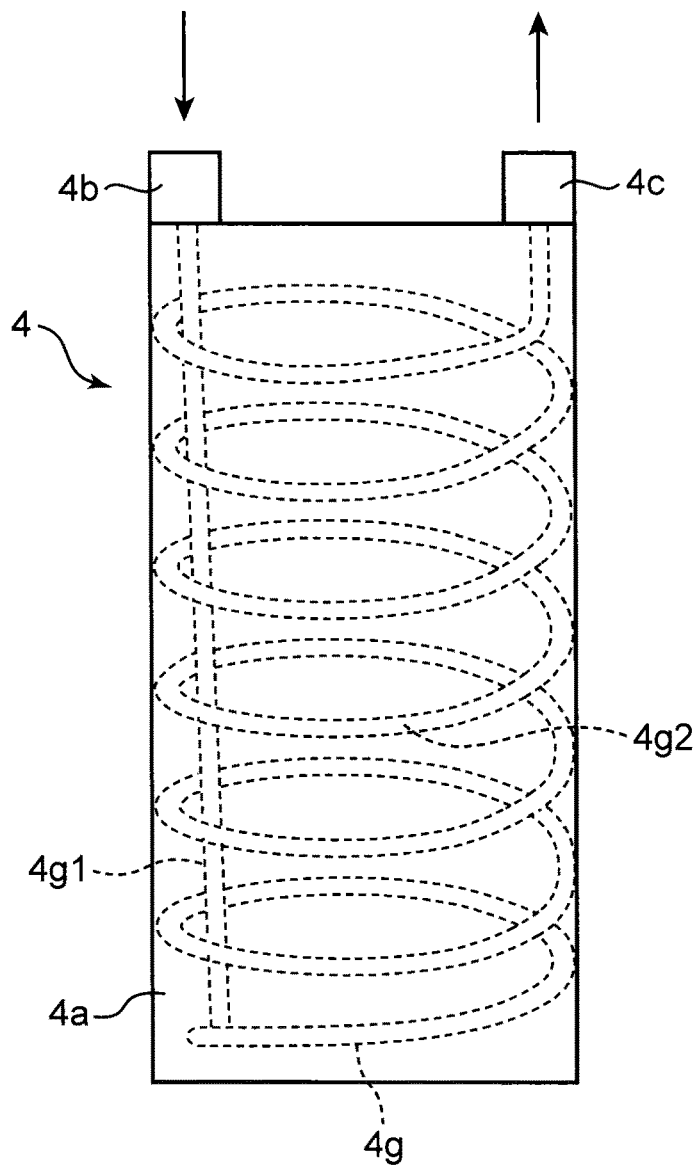
FIG. 9A is a front view of another variation example of the cooling unit in accordance with the present invention.
Figure 9B:
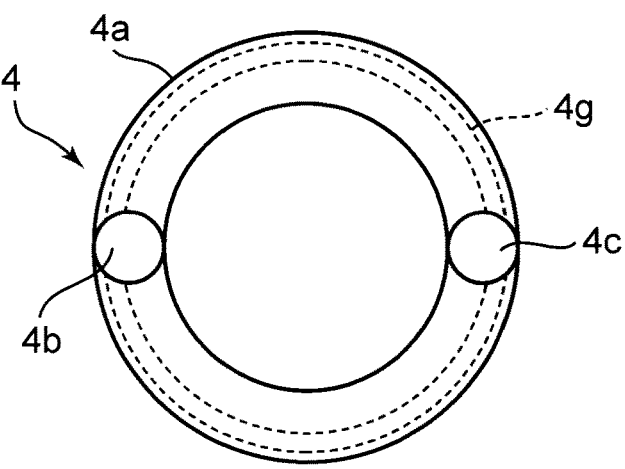
FIG. 9B is a plan view of the cooling unit depicted in FIG. 9A.

As another example of the main body portion 4a, as depicted in FIGS. 8A and 8B, a plurality of guide plates 4f that guides the refrigerant flow in the vertical direction may be provided inside the annular flow channel 4e of the main body portion 4a. Among the guide plates 4f, those projecting downward from the top wall of the main body portion 4a and those projecting upward from the bottom wall are arranged differently from each other. Those guide plates 4f make it possible to obtain the refrigerant flow inside the annular flow channel 4e which is uniform in the longitudinal direction of the main body portion 4a. In yet another example of the main body portion 4a, as depicted in FIGS. 9A and 9B, the main body portion 4a may be provided with a guidance tube 4g through which the refrigerant circulates. The guidance tube 4g has a straight tubular portion 4g1 that communicates with the introducing portion 4b and a spiral tubular portion 4g2 connected between the lower end of the straight tubular portion 4g1 and the discharge portion 4c. The spiral tubular portion 4g2 is arranged along the inner circumferential surface of the main body portion 4a. Therefore, the entire side surface of the main body portion 4a can be uniformly cooled by the refrigerant flowing inside the spiral tubular portion 4g2.

As depicted in FIGS. 1 and 2, the rotating table unit 3 is provided with a rotating table main body 11, a cart unit 12 that supports the rotating table main body 11, a revolving gear 14, a central gear 15, a rotating gear 16, and a circular guide portion 17.

The cart unit 12 is provided with a table base 12a and a plurality of wheels 12b which is attached to the lower portion of the table base 12a. The rotating table unit 3 can be freely moved between the inside of the chamber 2 and the outside by rolling the wheels 12b on a flat surface outside the chamber 2 (for example, on a placement surface for a conveying cart for conveying the rotating table unit 3, or the floor of a building). An annular protrusion 12a1 is formed at the upper surface of the table base 12a.

The central gear 15 is fixed to the upper end of the annular protrusion 12a1 on the upper surface of the table base 12a.

The circular guide portion 17 is attached to the upper surface of the central gear 15. The circular guide portion 17 is provided with an annular rail portion 17a and a plurality of balls 17b provided along the rail portion 17a. The rail portion 17a is fixed to the upper surface of the central gear 15. The balls 17b are arranged on the upper surface of the rail portion 17a so as to be capable of rolling along the rail portion 17a. Further, the balls 17b are interposed between the rail portion 17a and the rotating table main body 11.

A cooling unit placement portion 21 configured to allow the cooling unit 4 to be placed on the cooling unit placement portion 21 is formed in the central portion of the upper surface of the rotating table main body 11 and on the periphery thereof. Further, the rotating table main body 11 has a plurality of rotating stands 13 arranged such as to surround the periphery of the cooling unit placement portion 21. Workpiece placement portions 22 configured to allow the workpieces W on the workpiece placement portions 22 are placed respectively, are formed at the upper surface of the rotating stands 13. Thus, the cooling unit placement portion 21 and the workpiece placement portions 22 surrounding the periphery thereof are arranged on the upper surface of the rotating table main body 11.

The rotating table main body 11 is supported from below by the balls 17b of the circular guide portion 17. Therefore, the rotating table main body 11 is allowed to rotate about a vertical axis C as a result of the balls 17b rolling on the rail portion 17a. With the rotating table main body 11 of such a configuration, the workpieces W placed on the workpiece placement portions 22 can rotate about the vertical axis C.

The rotating table main body 11 has a shaft 11a extending downward from the central portion of the lower surface of the rotating table main body 11. The shaft 11a projects downward of the table base 12a via through holes formed in the center of the table base 12a and the center of the central gear 15. The inner diameters of those through holes are set such as to allow the shaft 11a to rotate. The revolving gear 14 is fixed to the lower end of the shaft 11a. The revolving gear 14 can mesh with the drive gear 18 located inside the chamber 2 when the rotating table unit 3 is inserted into the chamber 2. The drive gear 18 is coupled to a drive shaft 19a of a motor 19.

Each rotating stand 13 has a shaft 13a extending downward through the rotating table main body 11. The shafts 13a project downward of the rotating table main body 11 via through holes formed on the outer circumference of the rotating table main body 11. The inner diameter of those through holes is set such as to allow the shafts 13a to rotate.

The rotating gear 16 is fixed to the lower end of the shaft 13a. The rotating gear 16 meshes with the central gear 15 fixed to the table base 12a. As a result, the rotating gear 16 revolves about the rotation center (vertical axis C) of the rotating table main body 11 synchronously with the rotation of the rotating table main body 11 and also rotates while being meshed with the central gear 15. As a consequence, the rotating stands 13 coupled to the rotating gears 16 also rotate, thereby enabling the workpieces W placed on the rotating stands 13 to revolve about the vertical axis C and rotate.

The lifting mechanism 5 lifts and lowers the cooling unit 4 inside the space 2e between a first position I in which the cooling unit is placed on the rotating table main body 11 and a second position II in which the cooling unit is spaced upward from the rotating table main body 11 and faces side surfaces of the workpieces W placed on the workpiece placement portions 22.

More specifically, the lifting mechanism 5 is provided with a hook 23 and an upper lifting unit 24 which lifts and lowers the hook 23.

The upper lifting unit 24 is attached to the top wall 2a of the chamber 2.

The hook 23 is disposed inside the space 2e of the chamber 2. The hook 23 is provided at the upper lifting unit 24 such as to hang down toward the interior of the space 2e. The proximal end portion of the upper end of the hook 23 is coupled to the portion of the upper lifting unit 24 that projects into the space 2e through the top wall 2a of the chamber 2. The hook 23 is bent between the proximal end portion and a distal end portion 23a, and the distal end portion 23a faces obliquely upward.

The hook 23 can be lifted and lowered between an upper position (see FIGS. 1 and 6) and a lower position (see FIGS. 3 to 5) by the upper lifting unit 24.

Figure 4:
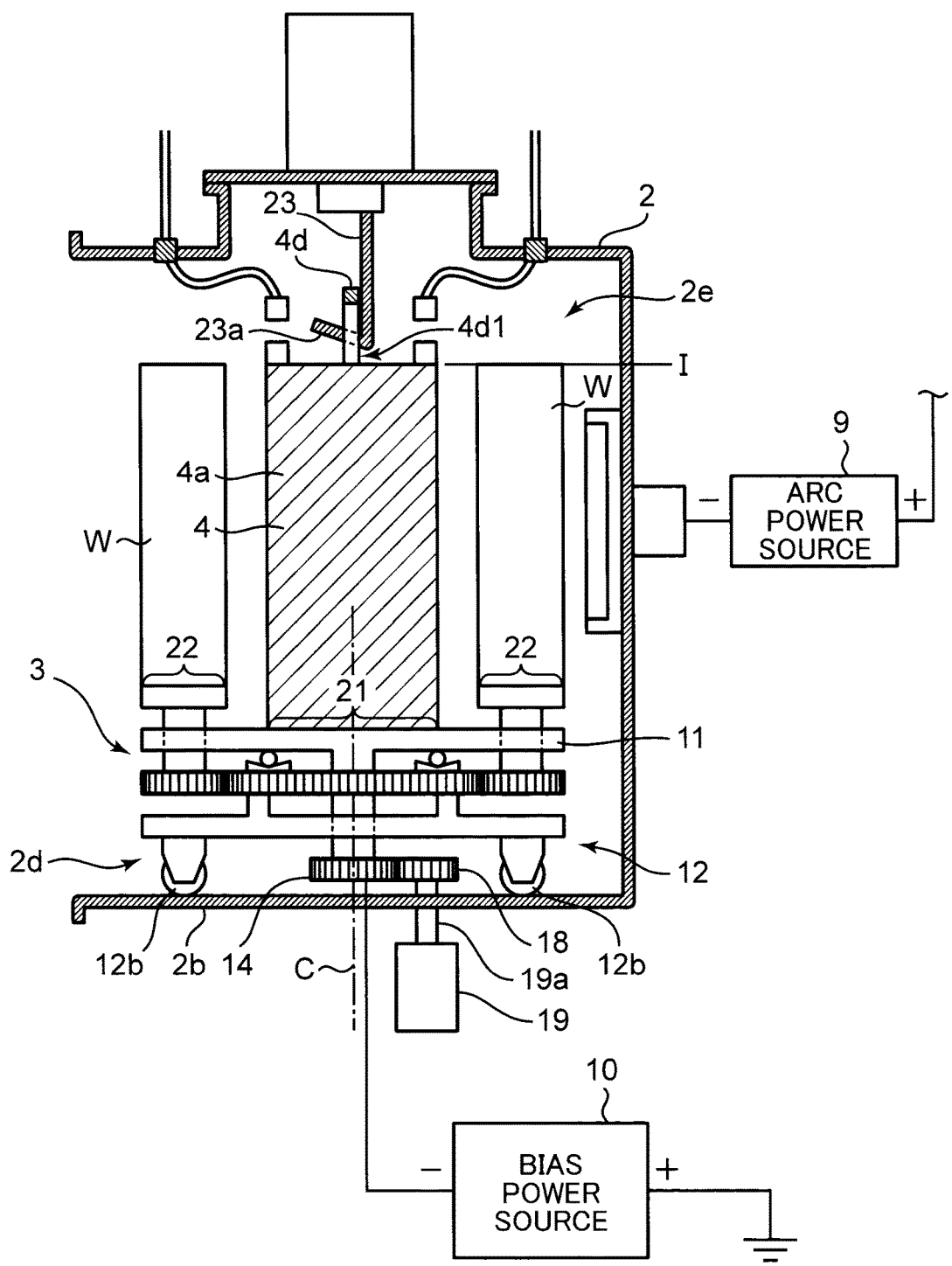
FIG. 4 is an explanatory drawing illustrating a state in which the rotating table unit is inserted into the chamber in the deposition method using the deposition device depicted in FIG. 1.
Figure 5:
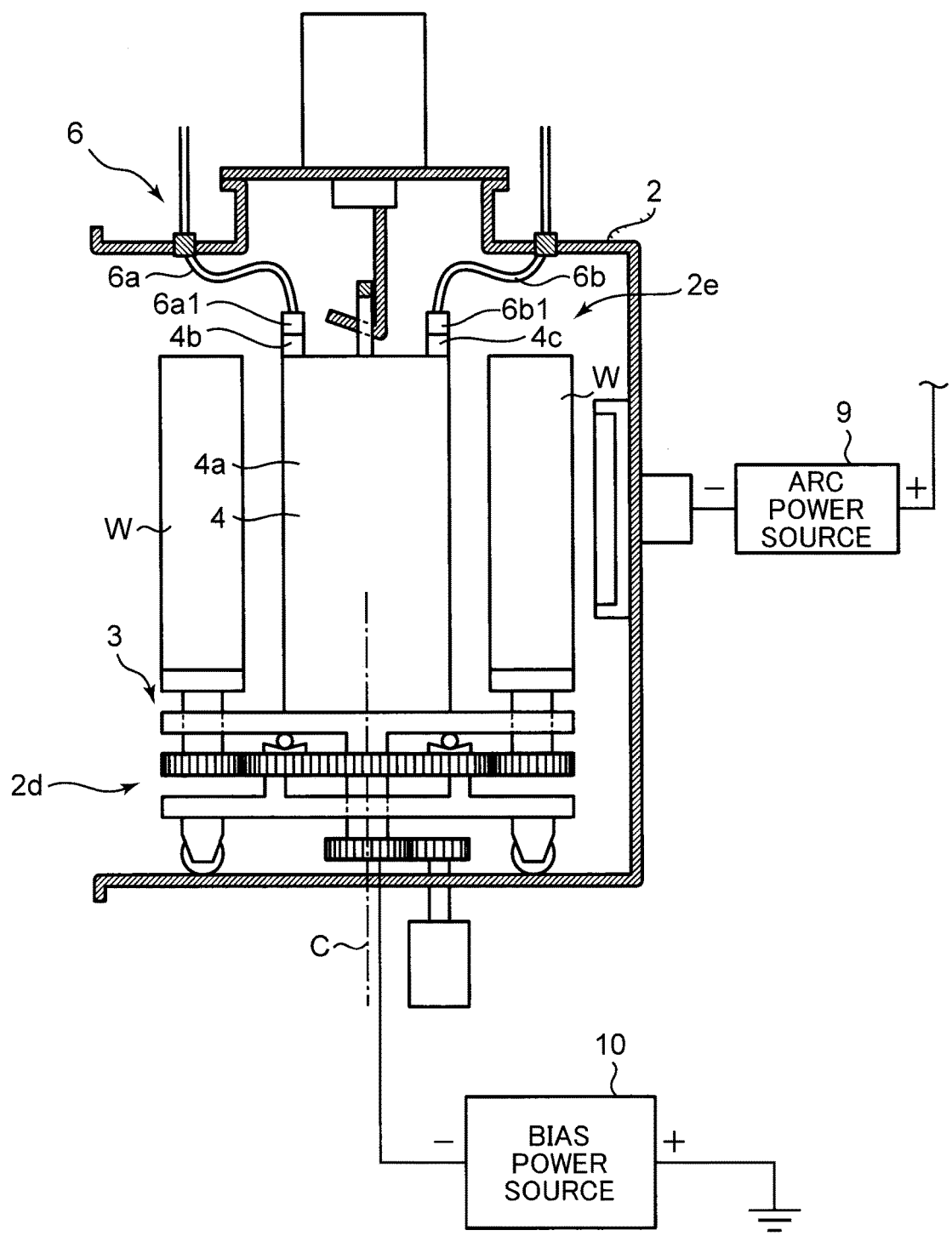
FIG. 5 is an explanatory drawing illustrating the step for connecting refrigerant piping to the cooling unit in the deposition method using the deposition device depicted in FIG. 1.

In the lower position of the hook 23 which is depicted in FIGS. 3 to 5, the hook 23 is set to a position in which the hook can be engaged with the engagement portion 4d of the cooling unit 4 located at the first position I, more specifically the hook is set to a position such that the distal end portion 23a of the hook 23 and the insertion hole 4d1 of the engagement portion 4d are at the same height. Therefore, the distal end portion 23a of the hook 23 is inserted into the insertion hole 4d1 of the engagement portion 4d of the cooling unit 4 as a result of inserting the rotating table unit 3 into the chamber 2 in a state in which the cooling unit 4 is placed on the rotating table main body 11 when the hook 23 is at the lower portion. As a consequence, the hook 23 can be coupled to the engagement portion 4d at the top of the cooling unit 4.

Figure 6:
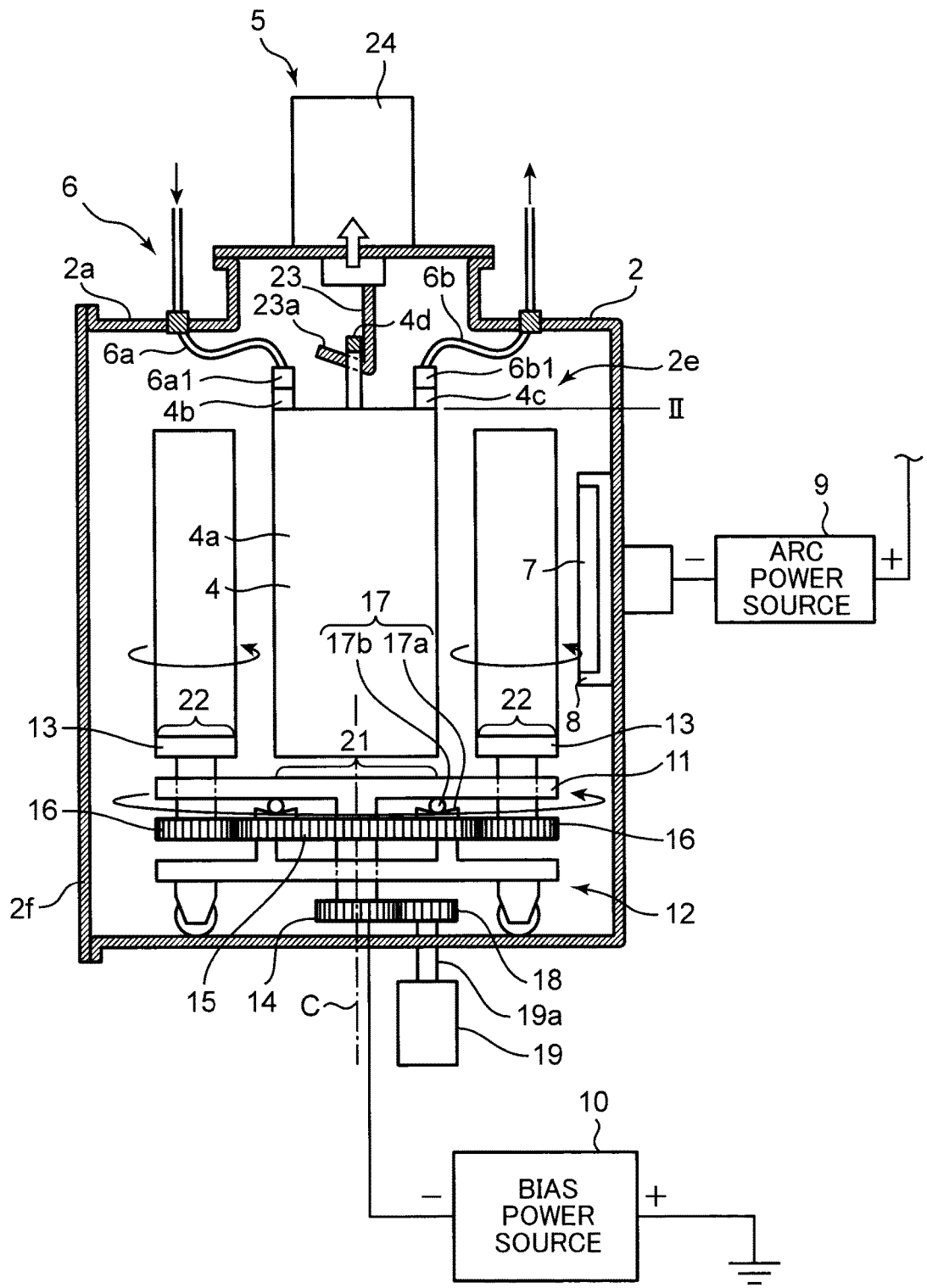
FIG. 6 is an explanatory drawing illustrating the step for moving the cooling unit from the first position to the second position with the lifting mechanism and the subsequent deposition step in the deposition method using the deposition device depicted in FIG. 1.

The upper position of the hook 23 which is depicted in FIGS. 1 and 6 is above the lower position. In this position of the hook 23, the cooling unit 4 is suspended in the second position II.

The upper lifting unit 24 may be a mechanism that can lift and lower the cooling unit 4 between the first position I and the second position II by lifting and lowering the hook 23 in a state in which the hook 23 is coupled to the engagement portion 4d at the top of the cooling unit 4. The upper lifting unit 24 is provided, for example, with a hydraulic cylinder.

The refrigerant piping 6 is attached to the top wall 2a of the chamber 2 and detachably connected to the cooling unit 4 to supply the refrigerant to the cooling unit 4. More specifically, the refrigerant piping 6 has an introducing pipe 6a for introducing a refrigerant such as water from outside the chamber 2 into the chamber 2, and a discharge pipe 6b for discharging the refrigerant from the inside of the chamber 2 to the outside of the chamber 2. The introducing pipe 6a has a connection portion 6a1 detachably connectable to the introducing portion 4b of the cooling unit 4. The discharge pipe 6b has a connection portion 6b1 detachably connectable to the discharge portion 4c of the cooling unit 4.

The target 7 and the target electrode 8 are attached to the inner side surface of the side wall 2c of the chamber 2. The target 7 is a film material which is used when forming a film on the surface of the workpieces W by arc discharge or sputtering. The target 7 is, for example, a metal such as titanium and chromium, or an alloy including those metals. The target electrode 8 is an electrode connected to the target 7. The arc power source 9 applies a negative potential to the target 7 through the target electrode 8 and generates an arc discharge on the surface of the target 7. By generating an arc discharge on the surface of the target 7, it is possible to ionize the material of the target 7 and cause the emission of positive ions inside the chamber 2.

The bias power source 10 is electrically connected to the rotating table main body 11 by a wiring. The bias power source 10 applies a bias potential to the workpieces W placed on the workpiece placement portions 22 through the rotating table main body 11. As a result of the application of the bias potential to the workpieces W, the positive ions emitted inside the chamber 2 easily adhere to the surface of the workpieces W.

(Explanation of Deposition Method)

A deposition method using the deposition device 1 of the first embodiment will be explained hereinbelow with reference to the appended drawings.

Initially, as depicted in FIG. 3, the cooling unit 4 and the workpieces W are placed on the rotating table main body 11 of the rotating table unit 3 outside the chamber 2. More specifically, the cooling unit 4 is placed on the cooling unit placement portion 21 of the rotating table main body 11, and a plurality of workpieces W is placed on the workpiece placement portions 22 on the upper surface of the rotating stands 13 surrounding the cooling unit placement portion 21.

Then, as depicted in FIGS. 3 and 4, the rotating table unit 3 is inserted into the space 2e of the chamber 2. After the insertion of the rotating table unit 3 has been completed, as depicted in FIG. 4, the distal end portion 23a of the hook 23 hanging down from the top wall 2a of the chamber 2 is inserted into the insertion hole 4d1 of the engagement portion 4d of the cooling unit 4.

Then, as depicted in FIG. 5, the refrigerant piping 6 is connected to the cooling unit 4. More specifically, the connection portion 6a1 of the introducing pipe 6a in the refrigerant piping 6 is connected to the introducing portion 4b of the cooling unit 4, and the connection portion 6b1 of the discharge pipe 6b is connected to the discharge portion 4c of the cooling unit 4.

Then, as depicted in FIG. 6, the upper lifting unit 24 of the lifting mechanism 5 lifts the hook 23. As a result, the cooling unit 4 is lifted inside the chamber 2 from the first position I in which the cooling unit 4 is placed on the rotating table main body 11 to the second position II, and the cooling unit 4 is stopped in the second position II which is spaced from the rotating table main body 11. The door 2f of the chamber 2 is then closed. The air located inside the space 2e of the chamber 2 is thereafter discharged from the inside of the chamber 2 with a vacuum pump (not depicted in the figure). As a result, the space 2e of the chamber 2 is maintained in a vacuum state.

The deposition treatment of the workpieces W is then performed inside the chamber 2 while rotating the rotating table main body 11. At the same time, the workpieces W are cooled with the cooling unit 4 in the stationary state of the cooling unit 4.

More specifically, the revolving gear 14 which is meshed with the drive gear 18 is rotated by rotating the drive gear 18 with the drive motor 19. As a result, the rotating table main body 11, which is fixed to the revolving gear 14, rotates about the vertical axis C. At the same time, the rotating gears 16 revolve about the vertical axis C while meshing with the central gear 15 fixed to the cart unit 12. As a result, the rotating stands 13 fixed to the rotating gears 16 and the workpieces W placed on the rotating stands revolve, while rotating, about the vertical axis C. In this state, the arc power source 9 ionizes the target 7 by applying a negative potential to the target 7 through the target electrode 8. At the same time, a reaction gas such as nitrogen is introduced into the chamber 2, and the bias power source 10 applies a bias potential to the workpieces W through the rotating table main body 11. As a result, metal ions emitted from the target 7 adhere to the surface of the workpiece W, and therefore a film can be formed on the surface of the workpieces W. Further, while the deposition treatment is performed, the main body portion 4a of the cooling unit 4 is cooled by the refrigerant supplied through the refrigerant piping 6 in a stationary state of the main body portion in the second position II in which the main body portion is spaced upward from the rotating table main body 11. Since the workpieces W rotate around the main body portion 4a while facing the outer circumferential surface of the main body portion 4a in the stationary state, the radiant heat of the workpieces W is absorbed by the entire outer circumferential surface of the main body portion 4a.

The first embodiment explained hereinabove has the following features.

In the deposition device 1 of the first embodiment and the deposition method using the same, the lifting mechanism 5 is provided which lifts and lowers the cooling unit 4 inside the space 2e between the first position I in which the cooling unit is placed on the rotating table main body 11 and the second position II in which the cooling unit is spaced upward from the rotating table main body 11 and faces side surfaces of the workpieces W placed on the workpiece placement portions 22. Therefore, the deposition treatment of the workpieces W can be performed in a state in which the cooling unit 4 is spaced from the rotating table main body 11. Thus, in the state before the deposition treatment, the cooling unit 4 is arranged in the first position I in which the cooling unit is placed on the cooling unit placement portion 21 on the upper surface of the rotating table main body 11. The workpieces W are arranged on the workpiece placement portions 22 disposed such as to surround the periphery of the cooling unit placement portion 21. Then, the operation of connecting the refrigerant piping 6 to the cooling unit 4 and the operation of lifting the cooling unit 4 from the first position I to the second position II with the lifting mechanism 5 are performed inside the space 2e of the chamber 2. In the second position II, the cooling unit 4 is spaced upward from the rotating table main body 11 and faces the side surfaces of the workpieces W placed on the workpiece placement portions 22. Then, the rotating table main body 11 on which the workpieces W have been placed is rotated and the deposition treatment of the workpieces W is performed in the stationary state of the cooling unit 4 at the second position II. While the deposition treatment is thus performed, the cooling unit 4 remains stationary at the second position II which is spaced from the rotating table main body 11. Therefore, it is not necessary to use a rotary joint for supplying the refrigerant from the refrigerant piping 6 to the cooling unit 4. As a consequence, the risk of refrigerant leaks can be greatly reduced.

Further, since the workpieces W revolve around the periphery of the cooling unit 4, which is in a stationary state, while the deposition treatment is performed, the workpieces W face the entire circumference of the outer circumferential surface of the cooling unit 4. As a result, the cooling unit 4 can absorb the radiant heat from the workpieces W over the entire circumference of the outer circumferential surface. As a consequence, the cooling efficiency of the cooling unit 4 can be increased.

Further, in the deposition device 1 of the first embodiment, although the bias power source 10 applies the bias potential to the workpieces W through the rotating table main body 11 during the deposition treatment, since the cooling unit 4 is located at the second position II spaced from the rotating table main body 11, it is not required that the refrigerant piping 6 connected to the cooling unit 4 be electrically insulated from the chamber 2. Further, it is not necessary to interpose an insulating material between the rotating table main body 11 and the cooling unit 4. As a result, the structure of the deposition device 1 is simplified and the deposition device 1 of high reliability can be obtained. Furthermore, since the bias potential is not applied to the cooling unit 4 in the second position II while the deposition treatment is performed, the increase in current capacity of the bias power source can be suppressed. Furthermore, because heat generation caused by the application of bias potential does not occur, the cooling unit 4 can efficiently cool the workpieces W.

Further, in the deposition device 1 of the first embodiment, the chamber 2 has the opening 2d which communicates the space 2e with the outside of the chamber 2 and through which the rotating table main body 11 can pass. With such a configuration, before the deposition treatment, the cooling unit 4 and the workpieces W can be placed on the upper surface of the rotating table main body 11 outside the chamber 2, and the rotating table main body 11 can be inserted in this state into the space 2e of the chamber 2 through the opening 2d of the chamber 2. Therefore, the operation of mounting the cooling unit 4 and the workpieces W on the rotating table main body 11 can be easily performed. Further, the rotating table main body 11 can be removed from the space 2e through the opening 2d of the chamber 2 in a state in which the cooling unit 4 is placed on the rotating table main body 11. Therefore, the maintenance operation of the cooling unit 4 can be easily performed outside the chamber 2. For example, even when a certain film is formed on the surface of the cooling unit 4 during the deposition treatment of the workpieces W inside the chamber 2, the cooling unit 4 placed on the rotating table main body 11 can be easily removed from the chamber 2 after the deposition treatment. Therefore, the operation of removing the film which has adhered to the surface of the cooling unit 4 can be easily performed.

Further, in the deposition device 1 of the first embodiment, the lifting mechanism 5 has the hook 23, which is disposed inside the space 2e of the chamber 2 and coupled to the upper portion of the cooling unit 4 in a state in which the rotating table main body 11 with the cooling unit 4 placed thereon is inserted into the chamber 2, and the upper lifting unit 24 that is mounted on the chamber 2 and lifts or lowers the hook 23. The upper lifting unit 24 lifts or lowers the cooling unit 4 between the first position I and second position II by lifting or lowering the hook 23 in a state in which the hook 23 is coupled to the upper portion of the cooling unit 4. Thus, with the lifting mechanism 5, since the hook 23 is coupled to the upper portion of the cooling unit 4 to lift or lower the cooling unit 4, the lifting mechanism 5 can be disposed apart from the rotating table main body 11. Therefore, the lifting mechanism 5 cannot interfere with the rotating table main body 11. Further, the rotating table main body 11 can be freely designed without taking into account the arrangement of the lifting mechanism 5, and the presently available rotating tables can be used.

Further, in the deposition device 1 of the first embodiment, the upper lifting unit 24 is mounted on the top wall 2a of the chamber 2. The hook 23 is provided at the upper lifting unit 24 such that the hook hangs down toward the interior of the space 2e. The engagement portion 4d engageable with the hook 23 is provided at the upper end of the cooling unit 4. Therefore, by engaging the hook 23 with the engagement portion 4d at the upper end of the cooling unit 4, it is possible to couple the hook 23 easily and reliably to the cooling unit 4.

Further, in the deposition device 1 of the first embodiment, the hook 23 can be moved between the upper position and lower position. The lower position is set to a position in which the hook 23 can be engaged with the engagement portion 4d of the cooling unit 4 which is in the first position I. The upper position is set to a position which is above the lower position and in which the cooling unit 4 in the second position II is suspended on the hook 23. With such a configuration, by moving the hook 23 to the lower position, it is possible to engage the hook with the engagement portion 4d of the cooling unit 4 located in the first position I. Meanwhile, by moving the hook 23 engaged with the engagement portion 4d to the upper position, it is possible to suspend the cooling unit 4 easily in the second position II.

In the first embodiment, a rotating table unit is explained which is provided with the rotating stands 13 such that the workpieces W can be revolved about the vertical axis and also rotated, such a rotating table unit being an example of the rotating table in accordance with the present invention, but the present invention is not limited to such a configuration. In accordance with the present invention, the above-described operation effect can be also demonstrated with the deposition device equipped with a rotating table which does not have the rotating stands.

Further, in the first embodiment, the configuration is described in which the chamber 2 has the opening 2d which is open on the side and the rotating table unit 3 can be taken out to the outside of the chamber 2 through the opening 2d, but the present invention is not limited to such a configuration. The present invention can be also used with the configuration in which the rotating table is mounted rotatably inside the chamber.

Second Embodiment

In the first embodiment, the lifting mechanism equipped with the hook 23 on which the main body portion 4a of the cooling unit 4 is suspended from above and the upper lifting unit 24 that moves the hook 23 in the vertical direction is explained as an example of the lifting mechanism in accordance with the present invention, but the present invention is not limited to such a configuration. Thus, in the present invention, a lifting mechanism may be used that lifts and lowers the main body portion 4a of the cooling unit 4 by raising the main body portion 4a from below.

Figure 10:
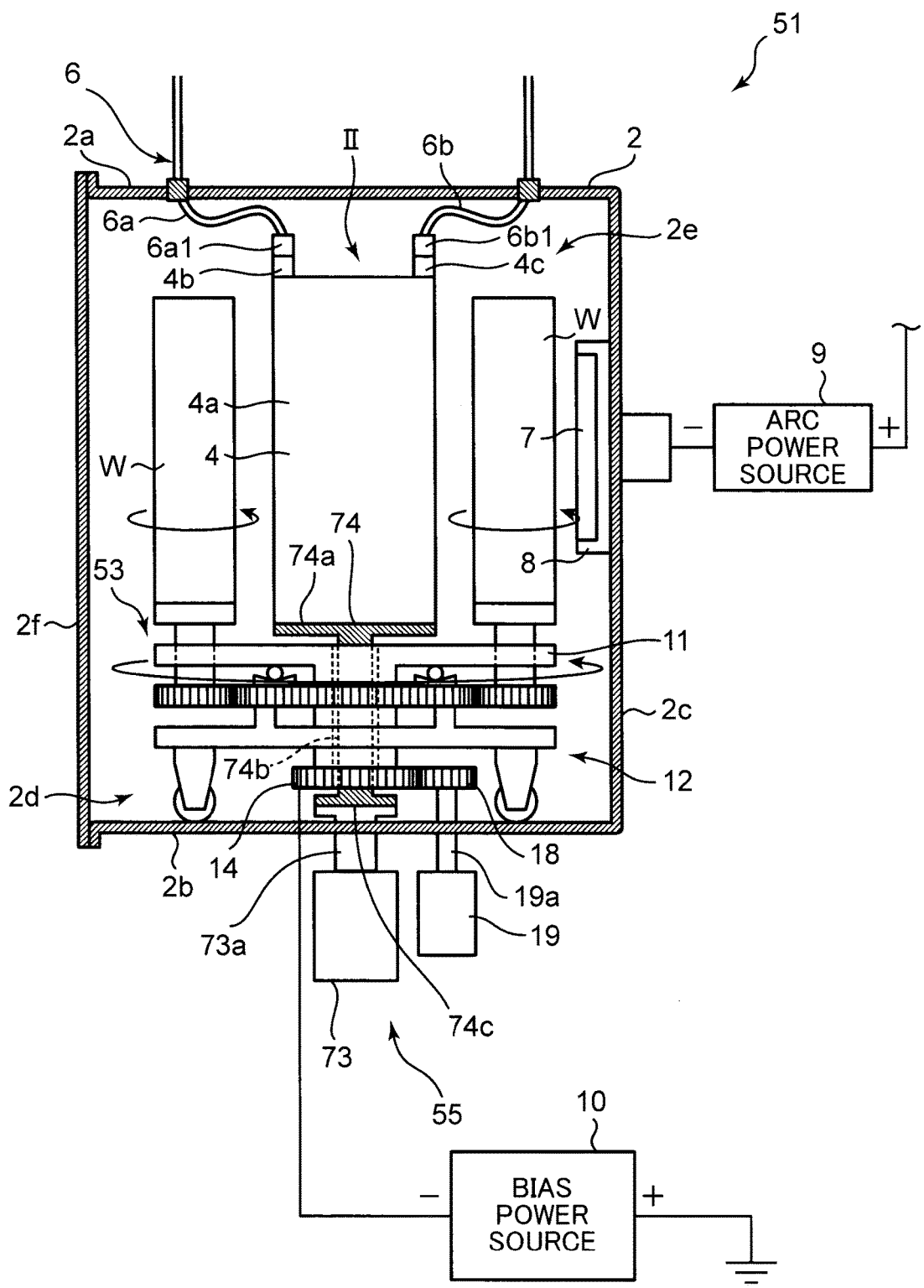
FIG. 10 is a cross-sectional view illustrating the entire configuration of the deposition device according to the second embodiment of the present invention.

As depicted in FIG. 10, the deposition device 51 of the second embodiment is equipped with a rotating table unit 53, a lifting mechanism 55, the chamber 2, the cooling unit 4, the refrigerant piping 6, the target 7, the target electrode 8, the arc power source 9, and the bias power source 10. Here, the chamber 2, the cooling unit 4, the refrigerant piping 6, the target 7, the target electrode 8, the arc power source 9, and the bias power source 10 are shared by the configuration of the deposition device 51 of the second embodiment and the configuration of the deposition device 1 of the first embodiment, and the explanation of the chamber 2, etc., is herein omitted.

Figure 11:
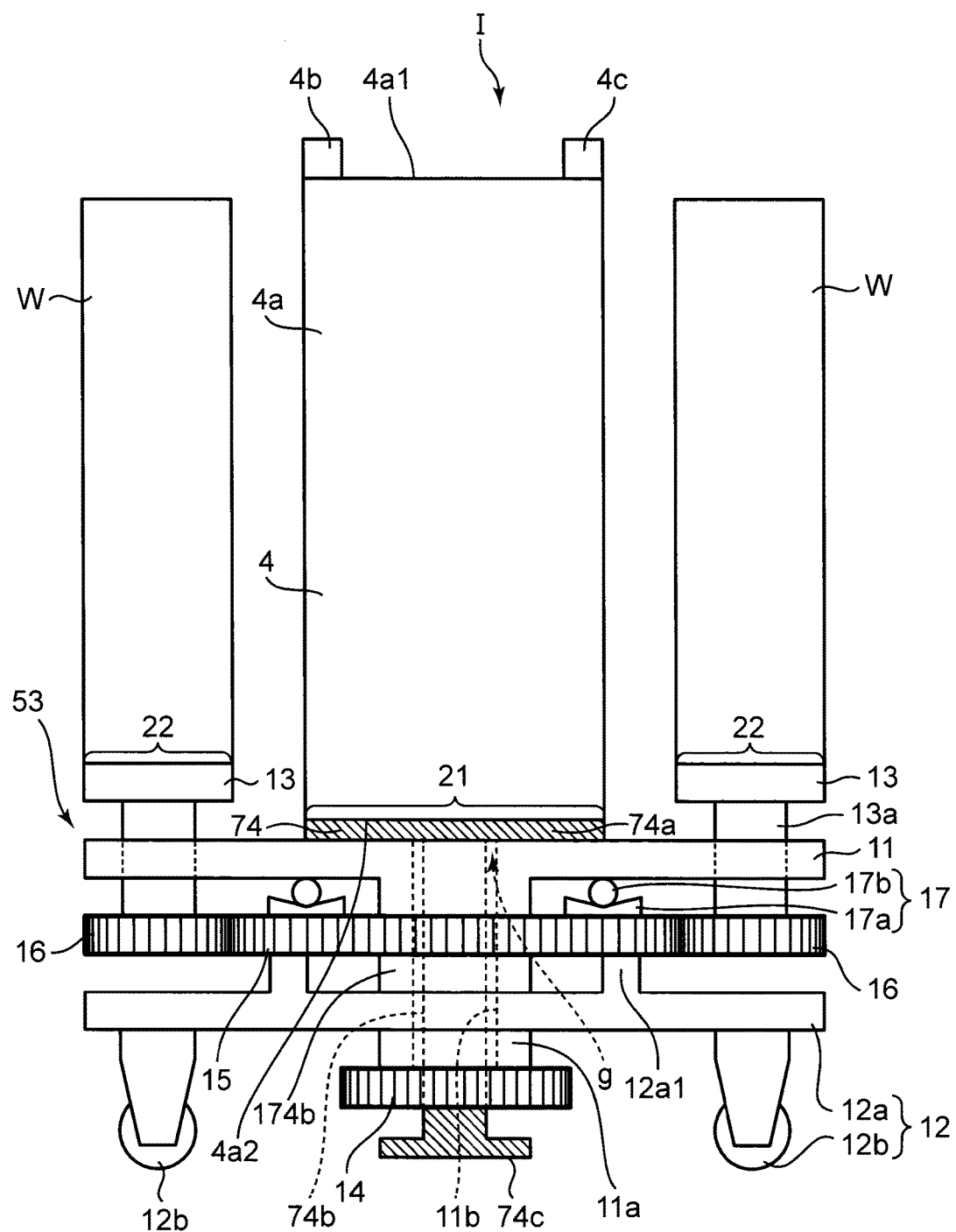
FIG. 11 is a front view illustrating the rotating table unit depicted in FIG. 10 and workpieces and a cooling unit placed thereon.

As depicted in FIGS. 10 and 11, the rotating table unit 53 is equipped with the rotating table main body 11, a cart unit 12 supporting the rotating table main body 11, the revolving gear 14, the central gear 15, the rotating gear 16, and the circular guide portion 17.

The rotating table unit 53 differs from the rotating table unit 3 of the first embodiment in that the rotating table main body 11 has a through hole 11b passing through the rotating table main body 11 in the vertical direction in the cooling unit placement portion 21. Concerning other features, the rotating table unit 53 is configured in the same manner as the rotating table unit 3 of the first embodiment.

The through hole 11b is formed such that the shaft 11a of the rotating table main body 11 passes therethrough. A lifting rod 74 of the below-described lifting mechanism 55 is inserted into the through hole 11b.

The through hole 11b has an inner diameter set to ensure a gap (g) such as to prevent contact between the inner wall of the through hole 11b and a portion (that is, the main body portion 74b) of the lifting rod 74 which has been inserted into the through hole 11b.

As depicted in FIG. 10, the lifting mechanism 55 is provided with the lifting rod 74 that raises the main body portion 4a of the cooling unit 4 and lifts or lowers the main body portion, and a lower lifting unit 73 that drives the lifting rod 74 in the vertical direction.

The lifting rod 74 is provided with a rod-shaped main body portion 74b, an abutment portion 74a coupled to the upper end of the main body portion 74b, and a coupling portion 74c coupled to the lower end of the main body portion 74b.

The rod-shaped main body portion 74b is inserted so as to be movable in the vertical direction inside the through hole 11b of the rotating table main body 11. The length of the main body portion 74b is set to be larger than the length of the through hole 11b of the rotating table main body 11. More specifically, the length of the main body portion 74b is set to be larger than the length of the through hole 11b by the lift stroke of the main body portion 4a of the cooling unit 4 (that is, by the difference in height between the first position (see FIG. 11) in which the main body portion 4a of the cooling unit 4 is placed on the cooling unit placement portion 21 of the upper surface of the rotating table main body 11 and the second position (see FIG. 10) in which the main body portion 4a is spaced upward from the rotating table main body 11).

The abutment portion 74a has a disk-like shape and is coupled to the upper end of the main body portion 74b. The abutment portion 74a is disposed within the range of the cooling unit placement portion 21 of the upper surface of the rotating table main body 11. In a state in which the cooling unit 4 is placed on the cooling unit placement portion 21, the abutment portion 74a abuts against the lower end surface of the main body portion 4a of the cooling unit 4.

In the present invention, the size of the abutment portion 74a is not particularly limited, provided that the abutment portion is larger than the inner diameter of the through hole 11b. The outer diameter of the abutment portion 74a is preferably larger than the outer diameter of the main body portion 4a of the cooling unit 4. As a result, the main body portion 4a can stably stand on the abutment portion 74a.

Further, the abutment portion 74a is larger than the through hole 11b and abuts against the upper surface of the rotating table main body 11. Therefore, the abutment portion 74a functions as a stopper preventing the lifting rod 74 from falling down from the through hole 11b.

The coupling portion 74c has a disk-like shape and is coupled to the lower end of the main body portion 74b. In a state in which the coupling portion 74c is not coupled to the lower lifting unit 73, the coupling portion is disposed at a position spaced downward from the revolving gear 14 at the lower end of the shaft 11a of the rotating table main body 11.

In the present invention, the lower lifting unit 73 is not particularly limited, provided that it is a mechanism that drives the lifting rod 74 linearly in the vertical direction. For example, the lower lifting unit can be provided with a hydraulic cylinder. The lower lifting unit 73 has a pushing portion 73a that moves linearly in the vertical direction and pushes the lifting rod 74 from below. The pushing portion 73a protrudes into the space 2e through the bottom wall 2b of the chamber 2. When the rotating table unit 53 is inserted into the chamber 2, the pushing portion 73a is arranged at a position such as to be directly below the coupling portion 74c of the lifting rod 74. As a result, where the pushing portion 73a is lifted, it can abut against the coupling portion 74c of the lifting rod 74 and push the lifting rod 74 from below. Therefore, where a drive force in the vertical direction is applied by the lower lifting unit 73 to the lifting rod 74 in a state in which the abutment portion 74a of the lifting rod 74 abuts against the lower end surface of the main body portion 4a of the cooling unit 4, the main body portion 4a of the cooling unit 4 can be lifted or lowered between the first position I (see FIG. 11) and the second position II (see FIG. 10).

The second embodiment explained hereinabove has the following features.

The deposition device 51 of the second embodiment is provided with the lifting mechanism 55 that lifts and lowers the main body portion 4a of the cooling unit 4 by raising the main body portion 4a from below. The lifting mechanism 55 lifts and lowers the cooling unit 4 in a state in which the lifting rod 74 is inserted into the through hole 11b of the rotating table main body 11 and the abutment portion of the lifting rod 74 abuts against the lower end surface of the cooling unit 4. Therefore, the lifting mechanism 55 can be arranged apart from the upper portion inside the space 2e of the chamber 2. As a result, the risk of the lifting mechanism 55 interfering with, for example, other parts disposed in the upper portion inside the chamber 2 can be avoided.

Furthermore, in the deposition device 51 of the second embodiment, even when the lifting rod 74 does not receive the drive force from the lower lifting unit 73, the lifting rod is prevented by the abutment portion 74a, which functions as a stopper, from falling down from the through hole 11b of the rotating table main body 11. Therefore, the lifting rod 74 can be removed from the chamber 2 or mounted on the chamber 2 together with the rotating table main body 11.

Further, in the deposition device 51 of the second embodiment, the through hole 11b has the inner diameter set to ensure a gap (g) such as to prevent contact between the inner wall of the through hole 11b and the main body portion 74b of the lifting rod 74 which has been inserted into the through hole 11b. As a result, since the gap (g) is ensured that prevents contact between the inner wall of the through hole 11b and the main body portion 74b of the lifting rod 74 which has been inserted into the through hole 11b, the lifting rod 74 is electrically insulated by the gap (g) from the rotating table main body 11, and the risk of the bias current leaking from the rotating table main body 11 to the lifting rod 74 can be avoided.

The deposition device 51 of the second embodiment can also demonstrate the operation effects specific to the first embodiment in the same manner as the deposition device 1 of the first embodiment.

Thus, in the deposition device 51 of the second embodiment, the cooling unit 4 is also in a stationary state in the second position II spaced from the rotating table main body 11 while the deposition treatment of the workpieces W is being performed. Therefore, it is not necessary to use a rotary joint for supplying the refrigerant from the refrigerant piping 6 to the cooling unit 4. Therefore, the risk of refrigerant leaks can be greatly reduced. Further, since the workpieces W revolve around the periphery of the cooling unit 4, which is in a stationary state, while the deposition treatment is performed, the workpieces W face the entire circumference of the outer circumferential surface of the cooling unit 4. As a result, the cooling unit 4 can absorb the radiant heat from the workpieces W over the entire circumference of the outer circumferential surface. As a consequence, the cooling efficiency of the cooling unit 4 can be increased.

Further, although the bias power source 10 applies the bias potential to the workpieces W through the rotating table main body 11 during the deposition treatment, since the cooling unit 4 is located at the second position II spaced from the rotating table main body 11, it is not required that the refrigerant piping 6 connected to the cooling unit 4 be electrically insulated from the chamber 2. Further, it is not necessary to interpose an insulating material between the rotating table main body 11 and the cooling unit 4. As a result, the structure of the deposition device 1 is simplified and the deposition device 1 of high reliability can be obtained. Furthermore, since the bias potential is not applied to the cooling unit 4 in the second position II while the deposition treatment is performed, the increase in current capacity of the bias power source can be suppressed. Furthermore, because heat generation caused by the application of bias potential does not occur, the cooling unit 4 can efficiently cool the workpieces W.

Further, before the deposition treatment, the cooling unit 4 and the workpieces W can be placed on the upper surface of the rotating table main body 11 outside the chamber 2, and the rotating table main body 11 can be inserted in this state into the space 2e of the chamber 2 through the opening 2d of the chamber 2. Therefore, the operation of mounting the cooling unit 4 and the workpieces W on the rotating table main body 11 can be easily performed. Further, the rotating table main body 11 can be removed from the space 2e through the opening 2d of the chamber 2 in a state in which the cooling unit 4 is placed on the rotating table main body 11. Therefore, the maintenance operation of the cooling unit 4 can be easily performed outside the chamber 2. For example, even when a certain film is formed on the surface of the cooling unit 4 during the deposition treatment of the workpieces W inside the chamber 2, the cooling unit 4 placed on the rotating table main body 11 can be easily removed from the chamber 2 after the deposition treatment. Therefore, the operation of removing the film which has adhered to the surface of the cooling unit 4 can be easily performed.

The risk of the refrigerant leaks can be also greatly reduced, to the same degree as in the first and second embodiments, with the configuration in which the cooling unit is fixedly suspended inside the chamber and arranged to be spaced upward from the rotating table, such a configuration being outside the scope of the present invention. Furthermore, since the radiant heat from the workpieces is absorbed by the entire circumference of the outer circumferential surface of the cooling unit, the cooling efficiency of the cooling unit is increased over that of the conventional deposition devices in which the cooling unit and the workpieces are together rotated on a table.

The above-described specific embodiments are mainly inclusive of the invention having the following features.

The deposition device of the present embodiments performs deposition treatment while cooling workpieces, the deposition device including: a chamber that has a space in which the workpieces are accommodated and the deposition treatment of the workpieces is performed; a cooling unit that cools the workpieces inside the space; a rotating table that rotates around a vertical axis in a state in which the workpieces are placed thereon and that has a cooling unit placement portion configured to allow the cooling unit to be placed thereon and workpiece placement portions which are arranged so as to surround the periphery of the cooling unit placement portion and configured to allow the workpieces to be placed thereon respectively; a lifting mechanism that lifts and lowers the cooling unit, inside the space, between a first position in which the cooling unit is placed on the rotating table and a second position in which the cooling unit is spaced upward from the rotating table and faces side surfaces of the workpieces placed on the workpiece placement portions; and refrigerant piping that is attached to the chamber and detachably connected to the cooling unit to supply a refrigerant to the cooling unit.

With the deposition device of such a configuration, in a state before the deposition treatment, the cooling unit is arranged in the first position in which the cooling unit is placed on the cooling unit placement portion. The workpieces are arranged on the workpiece placement portions disposed such as to surround the periphery of the cooling unit placement portion. Then, the operation of connecting the refrigerant piping to the cooling unit and the operation of lifting the cooling unit from the first position to the second position with the lifting mechanism are performed inside the space of the chamber. In the second position, the cooling unit is spaced upward from the rotating table and faces the side surfaces of the workpieces placed on the workpiece placement portions. Then, the rotating table on which the workpieces have been placed is rotated and the deposition treatment of the workpieces is performed in the stationary state of the cooling unit at the second position. While the deposition treatment is thus performed, the cooling unit remains stationary at the second position which is spaced from the rotating table. Therefore, it is not necessary to use a rotary joint for supplying the refrigerant from the refrigerant piping to the cooling unit. As a consequence, the risk of refrigerant leaks can be greatly reduced.

Further, since the workpieces revolve around the periphery of the cooling unit, which is in a stationary state, while the deposition treatment is performed, the workpieces face the entire circumference of the outer circumferential surface of the cooling unit. As a result, the cooling unit can absorb the radiant heat from the workpieces over the entire circumference of the outer circumferential surface. As a consequence, the cooling efficiency of the cooling unit can be increased.

Further, it is preferred that a bias power source be further provided that applies through the rotating table a bias potential to the workpieces placed on the workpiece placement portions.

A bias potential has been conventionally applied to a workpiece in order to improve deposition ability during arc discharge or sputtering. Thus, the deposition treatment has been usually performed by applying a negative bias potential to the workpiece through the rotating table in order to draw metal ions or gas ions, which are the film material, to the workpiece with the object of forming an adhesive dense film on the workpiece surface. However, in the deposition device described in Patent Literature 1, the cooling unit is placed on the rotating table, and refrigerant piping in which the refrigerant circulates between the chamber and the cooling unit is attached to the chamber wall. As a result, electricity can flow between the rotating table and chamber through the cooling unit and refrigerant piping. Therefore, it can be impossible to apply a bias potential to the workpiece on the rotating table. For this reason, in order to apply a bias potential to the workpiece, it is necessary to insulate the refrigerant piping electrically from the chamber, or use non-conductive, for example resin, piping as the refrigerant piping, or insert an insulator between the cooling unit and the work table. However, where the deposition treatment is performed in the chamber, the film is also deposited on the insulating materials and resin piping. Therefore, the insulating material and resin piping easily become conductive. Another problem is that those insulating material and resin piping have poor resistance to heat generated during the deposition treatment. Yet another problem is that since the bias potential is also applied to the cooling unit, the inflow area of the bias potential (the so-called, ion current) enlarges, and therefore the current capacity of the bias power source should be unnecessarily increased. Still another problem is that since the bias current flows on the cooling surface of the cooking unit, the cooling surface generates heat and cooling efficiency is greatly reduced.

However, in the present embodiments, in the configuration equipped with the bias power source, although the bias power source applies the bias potential to the workpieces through the rotating table, the cooling unit is located at the second position spaced from the rotating table during the deposition treatment. Therefore, it is not required that the refrigerant piping connected to the cooling unit be electrically insulated from the chamber. Further, it is not necessary to interpose an insulating material between the rotating table and the cooling unit. As a result, the structure of the deposition device is simplified and a deposition device of high reliability can be obtained. Furthermore, since the bias potential is not applied to the cooling unit in the second position while the deposition treatment is performed, the increase in current capacity of the bias power source can be suppressed. Furthermore, because heat generation caused by the application of bias potential does not occur, the cooling unit can efficiently cool the workpieces.

Further, it is preferred that the chamber has an opening that communicates the space with the outside of the chamber and has a size such that the rotating table can be moved therethrough.

With such a configuration, before the deposition treatment, the cooling unit and the workpieces can be placed on the upper surface of the rotating table outside the chamber, and the rotating table can be inserted in this state into the space of the chamber through the opening of the chamber. Therefore, the operation of mounting the cooling unit and the workpieces on the rotating table can be easily performed.

Further, the rotating table can be removed from the space through the opening of the chamber in a state in which the cooling unit is placed on the rotating table. Therefore, the maintenance operation of the cooling unit can be easily performed outside the chamber. For example, even when a certain film is formed on the surface of the cooling unit during the deposition treatment of the workpieces inside the chamber, the cooling unit placed on the rotating table can be easily removed from the chamber after the deposition treatment. Therefore, the operation of removing the film which has adhered to the surface of the cooling unit can be easily performed.

Further, it is preferred that the lifting mechanism has an upper coupling portion which is disposed inside the space of the chamber, and is coupled to an upper portion of the cooling unit in a state in which the cooling unit is placed on the rotating table and the rotating table is inserted into the chamber; and an upper lifting unit that is mounted on the chamber and lifts and lowers the upper coupling portion, wherein the upper lifting unit lifts and lowers the cooling unit between the first position and the second position by lifting and lowering the upper coupling portion in a state in which the upper coupling portion is coupled to the upper portion of the cooling unit.

With such a lifting mechanism, since the upper coupling portion is coupled to the upper portion of the cooling unit to lift or lower the cooling unit, the lifting mechanism can be disposed apart from the rotating table. Therefore, the lifting mechanism cannot interfere with the rotating table. Further, the rotating table can be freely designed without taking into account the arrangement of the lifting mechanism, and the presently available rotating tables can be used.

It is also preferred that the upper lifting unit be mounted on the top wall of the chamber; the upper coupling portion include a hook provided at the upper lifting unit so as to hang downward toward the interior of the space; and an engagement portion engageable with the hook be provided at an upper end of the cooling unit.

With such a configuration, by engaging the hook with the engagement portion at the upper end of the cooling unit, it is possible to couple the hook easily and reliably to the cooling unit.

Further, it is preferred that the hook could move between an upper position and a lower position; the lower position be set to a position in which the hook can engage with the engagement portion of the cooling unit located in the first position; and the upper position be set to a position which is above the lower position and in which the hook suspends the cooling unit in the second position.

With such a configuration, by moving the hook to the lower position, it is possible to engage the hook with the engagement portion of the cooling unit located in the first position. Meanwhile, by moving the hook engaged with the engagement portion to the upper position, it is possible to suspend the cooling unit easily in the second position.

It is also preferred that the rotating table has a through hole passing through the rotating table in the vertical direction in the cooling unit placement portion, and the lifting mechanism has a lifting rod that has an abutment portion configured to abut against a lower end surface of the cooling unit placed on the cooling unit placement portion and that is inserted to be capable of moving in the vertical direction inside the through hole of the rotating table; and a lower lifting unit that lifts and lowers the cooling unit between the first position and the second position by applying a drive force in the vertical direction to the lifting rod in a state in which the abutment portion of the lifting rod abuts against the lower end surface of the cooling unit.

The lifting mechanism lifts and lowers the cooling unit in a state in which the lifting rod is inserted into the through hole of the rotating table and the abutment portion of the lifting rod abuts against the lower end surface of the cooling unit. Therefore, the lifting mechanism can be arranged apart from the upper portion of the interior space of the chamber. As a result, the risk of the lifting mechanism interfering with other parts disposed in the upper portion inside the chamber can be avoided.

It is also preferred that the lifting rod has a stopper preventing the lifting rod from falling down from the through hole.

With such a configuration, even when the lifting rod does not receive the drive force from the lower lifting unit, the lifting rod is prevented by the stopper from falling down from the through hole of the rotating table. Therefore, the lifting rod can be removed from the chamber or mounted on the chamber together with the rotating table.

It is also preferred that the through hole has an inner diameter set to ensure a gap preventing contact between an inner wall of the through hole and a portion of the lifting rod which has been inserted into the through hole.

With such a configuration, since the gap is ensured that prevents contact between the inner wall of the through hole and the portion of the lifting rod which has been inserted into the through hole, the lifting rod is electrically insulated by the gap from the rotating table, and the risk of the bias current leaking from the rotating table to the lifting rod can be avoided.

The deposition method of the embodiments uses the deposition device and includes: a step for placing the cooling unit and the workpieces on the rotating table and inserting the rotating table into the space of the chamber; a step for connecting the refrigerant piping to the cooling unit; a step for lifting the cooling unit inside the chamber from the first position in which the cooling unit is placed on the rotating table to the second position, and spacing the cooling unit from the rotating table; and a step for performing deposition treatment of the workpieces inside the chamber, while rotating the rotating table, and also cooling the workpieces with the cooling unit in a stationary state of the cooling unit.

With such a method, the cooling unit and the workpieces are placed on the upper surface of the rotating table outside the chamber before the deposition treatment, and the rotating table is inserted into the chamber. Therefore, the operation of mounting the cooling unit and workpieces on the rotating table can be easily performed. Further, as a result of performing the step for inserting the rotating table into the rotating table chamber and then connecting the refrigerant piping to the cooling unit inside the space of the chamber, and the step for lifting the cooling unit from the first position to the second position with the lifting mechanism, the cooling unit is spaced upward from the rotating table and set to face the side surfaces of the workpieces placed on the workpiece placement portions. Then, the rotating table on which the workpieces have been placed is rotated and the deposition treatment of the workpieces is performed in the stationary state of the cooling unit at the second position. As a result, while the deposition treatment is performed, the cooling unit remains stationary at the second position which is spaced from the rotating table. Therefore, it is not necessary to use a rotary joint for supplying the refrigerant from the refrigerant piping to the cooling unit. As a consequence, the risk of refrigerant leaks can be greatly reduced.

Further, while the deposition treatment is performed, the workpieces rotate around the periphery of the cooling unit which is in a stationary state. Therefore, the outer circumferential surface of the cooling unit can absorb the radiant heat from the workpieces while facing the side surfaces of the workpieces over the entire circumference. As a result, the cooling efficiency of the cooling unit can be increased.

As described hereinabove, with the deposition device and deposition method in accordance with the present invention, the risk of refrigerant leaks can be greatly reduced. Furthermore, the cooling efficiency can be increased.

The invention claimed is:

1. A deposition device that performs deposition treatment while cooling a plurality of workpieces, the deposition device comprising:
   a chamber that has a space in which the plurality of workpieces are accommodated and the deposition treatment of the plurality of workpieces is performed;
   a cooler that cools the plurality of workpieces inside the space;
   a rotating table that rotates around a vertical axis in a state in which the plurality of workpieces are placed thereon and that has a cooler placement portion configured to allow the cooler to be placed thereon and a plurality of workpiece placement portions which are arranged so as to surround the periphery of the cooler placement portion and configured to allow the plurality of workpieces to be placed thereon respectively, the rotating table being capable of being inserted into the space of the chamber from outside the chamber, together with the cooler placed on the cooler placement portion and the plurality of workpieces placed on the plurality of workpiece placement portions;
   a lift having a support supporting the cooler, that lifts and lowers the cooler as the support holds the cooler, inside the space, between a first vertical position in which the cooler is placed on the cooler placement portion of the rotating table and a second vertical position in which the cooler is spaced upward from the rotating table to allow the rotating table and the plurality of workpieces to be rotated relative to the cooler in a stationary state and faces respective outer side surfaces of the plurality of workpieces placed on the plurality of workpiece placement portions; and
   a refrigerant piping that is attached to the chamber and detachably connected to the cooler and which supplies a refrigerant to the cooler,
   wherein, while the deposition treatment of the plurality of workpieces is performed, the plurality of workpiece placement portions rotate around the vertical axis so as to rotate the plurality of workpieces placed on the plurality of workpiece placement portions around the cooler located at the second vertical position, respectively, wherein
   the support includes an upper portion which is disposed inside the space of the chamber, and is coupled to an upper portion of the cooler in a state in which the cooler is placed on the rotating table and the rotating table is inserted into the chamber, and
   the lift further has an upper lift, that is fixed to a top wall of the chamber at a fixed horizontal position directly above the first vertical position to lift and lower the cooler between the first vertical position and the second vertical position at the fixed horizontal position by lifting and lowering the upper portion in a state in which the upper portion is coupled to the upper portion of the cooler, and the cooler has an outer circumferential surface facing the plurality of workpieces when the cooler is in the second vertical position, the outer circumferential surface cooling the plurality of workpieces.

2. The deposition device according to claim 1, further comprising
a bias power source that applies through the rotating table a bias potential to the workpieces placed on the workpiece placement portions.

3. The deposition device according to claim 1, wherein the chamber has an opening that communicates the space with the outside of the chamber and has a size such that the rotating table can be moved therethrough.

4. A deposition device that performs deposition treatment while cooling a plurality of workpieces, the deposition device comprising:
a chamber that has a space in which the plurality of workpieces are accommodated and the deposition treatment of the plurality of workpieces is performed;
a cooler that cools the plurality of workpieces inside the space;
a rotating table that rotates around a vertical axis in a state in which the plurality of workpieces are placed thereon and that has a cooler placement portion configured to allow the cooler to be placed thereon and a plurality of workpiece placement portions which are arranged so as to surround the periphery of the cooler placement portion and configured to allow the plurality of workpieces to be placed thereon respectively, the rotating table being capable of being inserted into the space of the chamber from outside the chamber, together with the cooler placed on the cooler placement portion and the plurality of the workpieces placed on the plurality of the workpiece placement portions;
a lift having a support holding the cooler, that lifts and lowers the cooler as the support holds the cooler, inside the space, between a first vertical position in which the cooler is placed on the cooler placement portion of the rotating table and a second vertical position in which the cooler is spaced upward from the rotating table to allow the rotating table and the plurality of workpieces to be rotated relative to the cooler in a stationary state and faces respective outer side surfaces of the plurality of workpieces placed on the plurality of workpiece placement portions; and
a refrigerant piping that is attached to the chamber and detachably connected to the cooler and which supplies a refrigerant to the cooler,
wherein, while the deposition treatment of the plurality of workpieces is performed, the plurality of workpiece placement portions rotate around the vertical axis so as to rotate the plurality of workpieces placed on the plurality of workpiece placement portions around the cooler located at the second vertical position, respectively, wherein the support includes an upper portion which is disposed inside the space of the chamber, and is coupled to an upper portion of the cooler in a state in which the cooler is placed on the rotating table and the rotating table is inserted into the chamber, and
the lift further has an upper lift, that is fixed to a top wall of the chamber at a fixed horizontal position directly above the first vertical position to lift and lower the cooler between the first vertical position and the second vertical position at the fixed horizontal position by lifting and lowering the upper portion in a state in which the upper portion is coupled to the upper portion of the cooler, wherein
the upper portion includes a hook provided at the upper lift so as to hang downward toward an interior of the chamber; and
an engagement portion engageable with the hook is provided at an upper end of the cooler, and
the cooler has an outer circumferential surface facing the plurality of workpieces when the cooler is in the second vertical position, the outer circumferential surface cooling the plurality of workpieces.

5. The deposition device according to claim 4, wherein
the hook can move between an upper position and a lower position;
the lower position is set to a position in which the hook can engage with the engagement portion of the cooler located in the first vertical position; and
the upper position is set to a position which is above the lower position and in which the hook suspends the cooler in the second vertical position.

6. The deposition device according to claim 1, wherein
the plurality of the workpiece placement portions have respective rotation axes each being parallel to the vertical axis and,
while the deposition treatment of the plurality of workpieces is performed, the plurality of workpiece placement portions rotate around their respective rotation axes so as to rotate the plurality of workpieces placed on the plurality of workpiece placement portions around the rotation axes, respectively.

7. A deposition method using the deposition device according to claim the deposition method comprising:
a step of placing the cooling unit and the plurality of workpieces on the rotating table and inserting the rotating table into the space of the chamber;
a step of connecting the refrigerant piping to the cooler;
a step of lifting the cooler inside the chamber from the first position in which the cooler is placed on the rotating table to the second position, and spacing the cooler from the rotating table; and
a step of performing deposition treatment of the plurality of workpieces inside the chamber, while rotating the rotating table, and also cooling the plurality of workpieces with the cooler in a stationary state of the cooler.

* * * * *